United States Patent
Yacout et al.

(10) Patent No.: US 12,359,316 B2
(45) Date of Patent: Jul. 15, 2025

(54) HYDROGEN PERMEATION BARRIER COATINGS AND METHODS OF MAKING THE SAME

(71) Applicant: UCHICAGO ARGONNE, LLC, Chicago, IL (US)

(72) Inventors: Abdellatif M. Yacout, Naperville, IL (US); Sumit Bhattacharya, Darien, IL (US); Yinbin Miao, Naperville, IL (US); Nicolas E. Stauff, Oak Park, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 1060 days.

(21) Appl. No.: 16/925,782

(22) Filed: Jul. 10, 2020

(65) Prior Publication Data
US 2022/0010429 A1     Jan. 13, 2022

(51) Int. Cl.
| | | |
|---|---|---|
| *C23C 16/455* | (2006.01) | |
| *C23C 16/06* | (2006.01) | |
| *C23C 16/40* | (2006.01) | |
| *C23C 28/00* | (2006.01) | |
| *B32B 15/01* | (2006.01) | |

(52) U.S. Cl.
CPC ........ *C23C 16/45529* (2013.01); *C23C 16/06* (2013.01); *C23C 16/403* (2013.01); *C23C 28/32* (2013.01); *C23C 28/345* (2013.01); *C23C 28/42* (2013.01); *C23C 28/44* (2013.01); *B32B 15/01* (2013.01); *Y10T 428/12535* (2015.01); *Y10T 428/12542* (2015.01); *Y10T 428/12549* (2015.01); *Y10T 428/12576* (2015.01); *Y10T 428/12583* (2015.01); *Y10T 428/1259* (2015.01); *Y10T 428/12597* (2015.01); *Y10T 428/12604* (2015.01); *Y10T 428/12611* (2015.01); *Y10T 428/12618* (2015.01); *Y10T 428/12625* (2015.01)

(58) Field of Classification Search
None
See application file for complete search history.

(56) References Cited

U.S. PATENT DOCUMENTS

| | | | |
|---|---|---|---|
| 3,277,565 A | 10/1966 | Bohlander | |
| 3,784,384 A | 1/1974 | Webb | |
| 4,071,587 A | 1/1978 | Eggers | |
| 5,747,830 A * | 5/1998 | Okita | G02F 1/136209 249/111 |

(Continued)

FOREIGN PATENT DOCUMENTS

| | | |
|---|---|---|
| CN | 101265603 A | 9/2008 |
| CN | 101629028 A | 1/2010 |

(Continued)

OTHER PUBLICATIONS

Metal Supermarkets What are Refractory Metals; https://www.metalsupermarkets.com/what-are-refractory-metals/ ;Feb. 18, 2022 (Year: 2022).*

(Continued)

*Primary Examiner* — Xiaobei Wang
(74) *Attorney, Agent, or Firm* — MARSHALL, GERSTEIN & BORUN LLP

(57) ABSTRACT

Provided herein is a hydrogen permeation barrier coating, a coated substrate, and methods of coating a substrate.

21 Claims, 8 Drawing Sheets

(56) References Cited

U.S. PATENT DOCUMENTS

| | | | |
|---|---|---|---|
| 6,541,371 B1* | 4/2003 | Ashtiani | H01L 21/2855 |
| | | | 438/653 |
| 8,652,589 B2 | 2/2014 | Ramm | |
| 2010/0123993 A1* | 5/2010 | Laor | H01G 9/15 |
| | | | 427/79 |
| 2015/0063523 A1 | 3/2015 | Yacout et al. | |
| 2017/0226633 A1* | 8/2017 | Cabral, Jr. | C23C 28/42 |
| 2020/0411758 A1* | 12/2020 | Lin | H10B 63/80 |

FOREIGN PATENT DOCUMENTS

| | | | | |
|---|---|---|---|---|
| CN | 103557612 A | | 2/2014 | |
| CN | 110670040 A | * | 1/2020 | ......... C23C 14/0036 |
| JP | 2008296434 A | * | 12/2008 | |
| KR | 20000027925 A | * | 5/2000 | ....... H01L 21/76841 |
| WO | WO-9426604 A1 | * | 11/1994 | ............. B65D 25/16 |

OTHER PUBLICATIONS

Translation—CN-110670040-A; Ding J; Jan. 10, 2020 (Year: 2020).*
Translation—JP-2008296434-A; Igari M ; Dec. 11, 2008 (Year: 2008).*
Anderson et al., Reactivity control of fast-spectrum reactors by reversible hydriding of yttrium zones, NASA TN D-4615 (1968).
Appel et al., Gamma Titanium Aluminide Alloys: Science and Technology, John Wiley & Sons (2011).
Bejaoui et al., ECRIX-H experiment: Synthesis of post-irradiation examinations and simulations, J. Nuclear Materials, 415(2):158-66 (2011).
Brimahll et al., Database on Permeation, Diffusion, and Concentration of Hydrogen Isotopes in Fusion Reactor Materials, Fusion Reactor Materials Semiannual Progress Report, DOE/ER-0313/16 (1994).
Chaffron et al., Innovative SiC/SiC Composite for Nuclear Applications, EPJ Web of Conferences (2013).
Chai et al., Ultra-thin Al2-O3 films grown by atomic layer deposition for corrosion protection of copper, RSC Advances, 4(92):50503-9 (2014).
Comeli et al., Effects of tempering temperature on the microstructure and creep resistance of X22C4MoV12-1 steel used on steam turbine blades, Am J Materials Sci., 8(4):65-72 (2018).
Dever et al., Research on high-termperature aerospace materials at NASA Glenn Research Center, J. Aerospace Engineering, 26(2):500-514 (2013).
El-Genk et al., A review of refractory metal alloys and mechanically alloyed-ixude dispersion strengthened steels for space nuclear power systems, J Nuclear Materials, 340(1):93-112 (2005).
Elen et al., Voids in vanadium, niobium and molybdenum by fast neutron irradiation at high temperatures, J. Nuclear Materials, 39(2):194-202 (1971).
Forcey et al., Formation of hydrogen permeation barriers on steels by aluminising, J. Nuclear Materials, 182:36 (1991).
Forcey et al., Hydrogen transport and solubility in 316L and 1.4914 steels for fusion reactor applications, J. Nucleaer Materials, 160:117-24 (1988).
Gibala et al., Hydrogen embrittlement and stress corrosion cracking, ASM International, 324 (1984).
Hishinuma et al., Void swelling in electron irradiated Hastelloy-X. J. Nuclear Science and Technology, 15(4): 288-295 (1978).
Hollenberg et al., Tritium/hydrogen barrier development, Fusion Engineering and Design, 28:190-208 (1995).
Honeycombe et al., Steels: Microstructure and Properties. Metallurgy and Materials Science, American Society for Metals (Jan. 1982).
Horak et al., Creep properties of Nb—1Zr and Nb—1Zr-0.1 C, No. ORNL-6809, Oak Ridge National Laboratory (1994).
Investigation of the Environment Fate of Tritium in the Atmosphere, Canadian Nuclear Safety Commission (CNSC), INFO-0792 (2009).

James et al., 700 Bar type IV H2 pressure vessel cost projections. In: Department of Energy Physical-Based Hydrogen Storage Workshop: Identifying Potential Pathways for Lower Cost 700 Bar Storage Vessels (2016).
Johnson et al., A brief review of atomic layer deposition: from fundamentals to applications, Materials Today, 16(5):236-46 (2014).
Katoh et al., Observation and possible mechanism of irradiation induced creep in ceramics, J. Nuclear Materials, 434(1-3):141-151 (2013).
Kellner, Space Age Ceramics Are Aviation's New Cup of Tea, General Electric Reports, downloaded from the Internet at: <https://www.ge.com/reports/space-age-cmcs-aviations-new-cup-of-tea/> (published Jul. 13, 2016).
Koyanagi et al., SiC/SiC Cladding Materials Properties Handbook, Technical Report ORNL/TM-2017/385, Oak Ridge National Laboratory (2017).
Leonard et al., Nb-base FS-85 alloy as a candidate structural material for space reactor applications: Effects of thermal aging, Metallurgical and Materials Transactions A, 40(4):838-55 (2009).
Lundin et al., Pressure-temperature-composition relationships of the yttrium-hydrogen system, J. Electrochemical Soc., 109(9):838-42 (1962).
Management of Tritium at Nuclear Facilities, IAEA Vienna, Technical Report Series No. 234, 1984.
Matejicek et al., Characterization of less common nitrides as potential permeation barriers, Fusion Engineering and Design, 139:74-80 (2019).
Merrigan, Heat Pipe Technology Issues, 1st Symposium on Space Nuclear Power Systems, Albuquerque, New Mexico, Jan. 11-13, 1984, Los Alamos National Laboratory LA-UR-84-1238 (1984).
Miao et al., Advanced moderation module for thermal neutron reactors operating at elevated temperatures, United States. doi:10.2172/1656612 (published Aug. 31, 2020).
Mueller et al. (eds.), Metal Hydrides, Elsevier 2013.
Muroga, Refractory metals as core materials for Generation IV nuclear reactors, In: Structural Materials for Generation IV Nuclear Reactors, pp. 415-440. Woodhead Publishing, 2017.
Olander et al., Uranium-zirconium hydride fuel properties, Nuclear Engineering and Design, 239(9):1406-24 (Aug. 2009).
Osborne et al., Reducing Irradiation Damage in a Long-Life Fast Reactor with Spectral Softening, Energies, 11(6):1507 (2018).
Perujo et al., Tritium permeation barriers for fusion technology, Fusion Engineering and Design, 28:252 (1995).
Prasad et al. (eds.), Aerospace Materials and Material Technologies, vol. 3, Singapore: Springer (2017).
Ribeiro et al., Hydrogen gas permeation through amorphous and partially crystallized Fe40Ni38Mo4B18, Mat. Res. vol. 15 No. 5 Aug. 30, 2012.
Sauder, Ceramic matrix composites: nuclear applications, Ceramic Matrix Composites: Materials, Modeling and Technology: pp. 609-646 (2014).
Senor et al., Thermophysical property correlations for the niobium-1% zirconium alloy, J. Nuclear Materials, 173(3):261-73 (1990).
Senor et al., Transport property correlations for the niobium-1% zirconium alloy, J. Nuclear Materials, 173(3):274-83 (1990).
Serra et al., Hydrogen permeation measurements on alumina, J. Am. Ceramic Soc., 88:15 (2005).
Shivprasad et al., High temperature moderator material for microreactors, No. LA-UR-20-21710, Los Alamos National Lab, United States (Feb. 25, 2020).
Simnad, The U—ZrHx alloy: its properties and use in TRIGA fuel, Nuclear Engineering and Design, 64(3):403-22 (1981).
Singh et al., Interlaboratory round robin study on axial tensile properties of SiC—SiC CMC tubular test specimens, Int. J. Applied Ceramic Technology, 15(6):1334-49 (2018).
Snead et al., Handbook of SiC properties for fuel performance modeling (thermal conductibility), J. Nuclear Materials, 371:329-77 (2007).
Snyder, Aircraft Nuclear Propulsion: An Annotated Bibliography, prepared for the United States Air Force History and Museums Program, May 3, 1996.

(56) References Cited

OTHER PUBLICATIONS

Song, Hydrogen permeation resistance of plasma-sprayed Al2O3 and Al2O3-13wt.% TiO2 ceramic coatings on austenitic stainless steel, Surface and Coatings Technology, 168:191 (2003).
Stone et al., Stress analysis and probabilistic assessment of multi-layer SiC-based accident tolerant nuclear fuel cladding, J. Nuclear Materials, 466:682-97 (2015).
Summary Report of HTRE No. 3 Nuclear Excursion, United States: N. p., 1965. Web. doi: 10.2172/4643464.
Suzuoka, Lattice and Grain Boundary Diffusion in polycrystals, Transactions of the Japan Institute of Metals, 1961 vol. 2 Issue 1 pp. 25-32.
Tamura, Hydrogen Permeation Characteristics of TiN-Coated Stainless Steels, Journal of Materials Science and Engineering A, 5 (5-6) (2015) 204-208.
U.S. Appl. No. 16/925,781, "Hydrogren Permeation Barrier Coatings and Methods of Making the Same", filed Jul. 10, 2020.
Vetrano, Hydrides as neutron moderator and reflector materials, Nuclear Engineering and Design, 14(3):390-412 (1971).
Ward et al., Technical challenges and future direction for high-efficiency metal hydride thermal energy storage systems, Appl. Physics A, 122(4):462 (2016).
Yokoyama et al. Proceedings of the International Conference on Nuclear Engineering (ICONE-9), pp. 8-12 (2001).
Yvon (ed.), Structural Materials for Generation IV Nuclear Reactors, Woodhead Publishing (2016).
Zhu, Aerospace ceramic materials: thermal, environmental barrier coatings and SiC/SiC ceramic matrix composites for turbine engine applications, NASA/TM-2018-219884 (2018).

* cited by examiner

HYDROGEN PERMEATION BARRIER COATINGS AND METHODS OF MAKING THE SAME

STATEMENT OF GOVERNMENT SUPPORT

This invention was made with government support under Contract No. DE-AC02-06CH11357 awarded by the United States Department of Energy to UChicago Argonne, LLC, operator of Argonne National Laboratory. The government has certain rights in the invention.

BACKGROUND

The notion of a hydrogen barrier appears to have arisen mainly due to three separate problems in technology. One is the apprehension regarding hydrogen embrittlement of metals and alloys; the second is achieving a low permeation rate of tritium in the upcoming conceptual and already developed designs for fusion power that involve deuterium-tritium plasmas and tritium breeding blankets; the third is efficiently retaining hydrogen within the metal hydride based moderation modules in advanced reactors operation at very high temperatures (Vetrano, J. B., Nuclear Engineering and Design 14, no. 3 (1971): 390-412). The main objective for application of hydrogen barrier coatings is to prevent hydrogen permeation into a material that could be damaged or degraded due to hydrogen uptake. Detrimental effects resulting from the high hydrogen solubility and diffusivity is readily available in literature. For example, stainless steel such as SS 316, will dissolve—twenty parts per million hydrogen atoms at room temperature and its permeation rate increases exponentially with temperature and a solubility of several thousand parts per million can exist at 800° C. in SS 316. Thus, the permeation rate has increased by few-orders of magnitude over room temperature (Forcey, K. S., et al., Journal of Nuclear Materials, 160, 117-24 (1988)). This leads to serious penalties since many steels and other alloys can be embrittled by this much hydrogen (Gibala, R. and R. F. Hehemann, eds. Hydrogen Embrittlement and Stress Corrosion Cracking. 1984, ASM: Metals Park, OH. 324). For fusion energy, the concerns are either tritium inventory in materials is unacceptably high or permeation through metallic components into flowing coolants is too high (Hollenberg, G. W., et al., Fusion Engineering and Design, 28, 190-208 (1995)). For thermal micro-reactors operating at very high temperature, hydride-based moderation modules help reduce the reactor size/weight, elongate the lifetime, and enhance the safety. On the other hand, for advance fast reactors targeting high burnup, introduction of hydride moderation modules may help soften the neutron spectrum to relieve radiation damage in structural materials (Osborne, A. G. and M. R. Deinert, Energies, 11(6), 1507 (2018)) and to enhance performance of burnable poison (Yokoyama, T. and H. Matsumiya, Proc. Int. Conf. on Nuclear Engineering (ICONE-9), pp. 8-12, 2001). Additionally, hydride moderation modules may also be used to improve some reactivity coefficients (increased Doppler, reduced sodium void worth) in fast neutron reactors. A key challenge of developing high-temperature moderation module is that hydrogen permeation through enclosure leads to degradation of moderation performance.

Therefore, diffusion barriers for such gases have been envisaged and developed from these three concerns: 1) reducing hydrogen uptake into materials to prevent degradation; 2) preventing tritium permeation through materials to reduce net radioactive transport to lower public health and safety issues; and 3) retaining hydrogen within the moderation module to ensure long-term performance of high-temperature moderation modules. Generally, barriers have been applied as external coatings on existing metallic alloys in order to prevent hydrogen/tritium uptake into the material substrate. Other than coating, material surface treatments are also designed and pursued to produce an external in-situ scale on the metal or alloy itself that serves as a diffusion barrier. In general, the most effective approach seems to be application of a suitable external coating with a low hydrogen/tritium solubility and has the ability to slow down the rate of hydrogen transport. While there are many oxides, carbides, and nitrides that possess low hydrogen permeation and also have other desirable properties such as high-temperature stability and corrosion protection, it seems the best choices for materials that possess inherently low affinity to hydrogen permeation, are metals like gold or tungsten and ceramics such as alumina or SiC.

SUMMARY

In embodiments, a hydrogen permeation barrier coating can include a plurality of alternating layers, wherein the plurality of alternating layers comprises alternating metal layers and ceramics layers, and wherein each alternating layer, independently, comprises a microstructure comprising nanocrystalline and/or equiaxed grains.

In embodiments, a coated substrate can include the hydrogen permeation barrier coating in accordance with embodiments of the disclosure and a substrate, wherein the substrate comprises one or more of a metal or alloy thereof, a metal with a ceramic composite structure, and a carbon fiber or composites thereof.

In embodiments, a method of coating a substrate can include depositing a hydrogen permeation barrier coating onto a substrate via atomic layer deposition (ALD), wherein the depositing comprises 1 or more deposition cycles of at least a first precursor and a second precursor, and each cycle of the first and second precursors comprises a pulse time of about 0.1 seconds to 20 seconds, a purge time of about 5 seconds to about 60 seconds, and a deposition temperature in a range of about 150° C. to about 400° C.

In embodiments, a method of coating a substrate can include depositing a single layer hydrogen permeation barrier coating onto a substrate via atomic layer deposition, wherein the hydrogen permeation barrier coating comprises a microstructure comprising nanocrystalline and/or equiaxed grains, and a defect density of about 0.001% to about 0.1%, wherein the depositing comprises 1 or more deposition cycles of at least a first precursor and a second precursor, and each cycle of the first and second precursors comprises a pulse time of about 0.1 seconds to 20 seconds, a purge time of about 5 seconds to about 60 seconds, and a deposition temperature in a range of about 150° C. to about 400° C.

DETAILED DESCRIPTION

Figure 1:
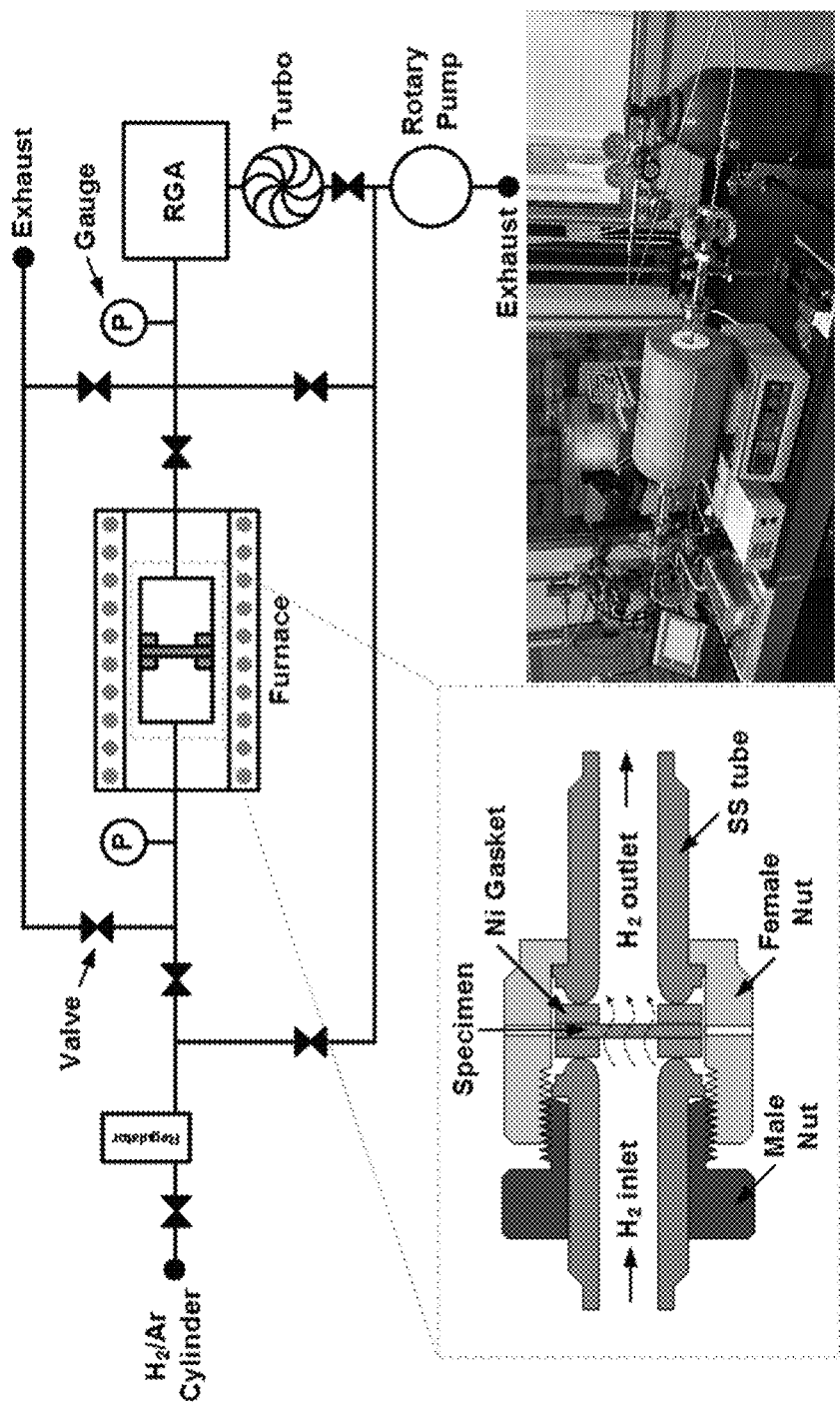
FIG. 1 is schematic illustration of an experimental set-up to test the hydrogen permeation of the hydrogen permeation barrier coating in accordance with embodiments of the disclosure.

In accordance with embodiments, a hydrogen permeation barrier coating can include a single layer or a plurality of alternating layers, and a microstructure having nanocrystalline and/or equiaxed grains. As used herein, the term "nanocrystalline grains" refers to the grains being crystalline in nature, not amorphous, and having a size on the nanoscale. For example, nanocrystalline grains can have average grain sizes of less than about 100 nm. As used herein, the term "equiaxed grains" refers to crystalline grains that have approximately equal dimensions in all directions. In accordance with embodiments herein the hydrogen permeation barrier coating is provided to prevent the permeation of $H_2$ and/or $H_3$.

In accordance with embodiments herein, the hydrogen permeation barrier coating can be used in low temperature ranges (e.g., 80° C. to 200° C.) and/or in high temperature ranges (e.g., 200° C. to 900° C. or more). In low temperature ranges, the hydrogen permeation barrier coating can include a single layer or a multi-layer structure. In high temperature ranges, the hydrogen permeation barrier coating can include a multi-layer structure.

It has been advantageously found that the methods of making the hydrogen permeation barrier coatings disclosed herein can advantageously result in coatings that are monolithic and pinhole free, resulting in excellent hydrogen barrier performance. For example, the hydrogen permeation barrier of the disclosure can have a hydrogen permeation of $1 \times 10^{-10}$ m/s/Torr$^{(0.5)}$ or less over a 24-hour time period at a temperature of up to 500° C. In embodiments, the hydrogen permeation barrier coating can withstand temperatures of greater than 600° C. without substantial degradation. In embodiments, the hydrogen permeation barrier coating can withstand temperatures of greater than 800° C. without substantial degradation. In embodiments, the hydrogen permeation barrier coating can withstand temperatures of greater than 900° C. without substantial degradation. In embodiments, the hydrogen permeation barrier coating can withstand temperatures of greater than 1000° C. without substantial degradation. As used herein, the term "substantial degradation" refers to cracking or spalling of any portion of the hydrogen permeation barrier coating after cycling from room temperature to the desired operating temperature. Heat cycling can be performed, for example, in a 4% $H_2$/96% Ar atmosphere over 24 hours.

In accordance with embodiments, a coated substrate is provided. The coated substrate can include the hydrogen permeation barrier coating of the disclosure and a substrate. In embodiments, the substrate can include one or more of a metal or alloys thereof, and a ceramic matrix composite. It has been advantageously found that the coated substrates of the disclosure can have excellent hydrogen barrier performance. For example, the coated substrate of the disclosure can have a hydrogen permeation of $1 \times 10^{-10}$ m/s/Torr$^{(0.5)}$ or less over a 24-hour time period at a temperature of up to 500° C. In embodiments, the coated substrate can withstand temperatures of greater than 600° C. without substantial degradation. In embodiments, the coated substrate can withstand temperatures of greater than 800° C. without substantial degradation. In embodiments, the coated substrate can withstand temperatures of greater than 900° C. without substantial degradation. In embodiments, the coated substrate can withstand temperatures of greater than 1000° C. without substantial degradation. In embodiments, the coated substrates can be useful for nuclear reactors (e.g., thermal neutron reactors or thermal neutron micro-reactors), hydrogen storage in automobiles, fusion-related research, and space travel applications.

Hydrogen Permeation Barrier Coating

In embodiments, the hydrogen permeation barrier coating can be a single layer structure, and can include one or more of oxides, nitrides, carbides, aluminides, silicides, elemental ceramics, complex oxides, and max phases, wherein the max phases are represented by the formula $M_{n+1}AX_n$ where n is an integer 1 to 4, M is a transition metal, and A is one or more of Al, Si, P, S, Ga, Ge, As, Cd, In, Sn, Ti, and Pb, and X is carbon and/or nitrogen. In embodiments, the hydrogen permeation barrier coating can include one or more of $Al_2O_3$, $Y_2O_3$, $ZrO_2$, $TiO_2$, $SiO_2$, $Cr_2O_3$, ZrN, TiN, AlN, SiN, ZrC, TiC, SiC, NbC, $Ti_2AlC$, $Zr_2TiC$, FeAl, $Fe_2Al_3$, $FeAl_2$, $Fe_2Al_5$, $ZrAl_3$, $MoSi_2$, $NbSi_2$, Si, ($ZrO_2 \cdot SiO_2$), and ($ZrO_2 \cdot xY_2O_3$). In embodiments, the hydrogen permeation barrier coating can include one or more of $Al_2O_3$, $ZrO_2$, and ZrN. In embodiments, the hydrogen permeation barrier coating can include or is $Al_2O_3$.

In embodiments, the hydrogen permeation barrier coating can be provided as a plurality of alternating layers. In embodiments, the plurality of alternating layers can include alternating metal layers and ceramic layers. In embodiments, the ceramics layers can include one or more of oxides, nitrides, carbides, aluminides, silicides, elemental ceramics, complex oxides, and max phases, wherein the max phases are represented by the formula $M_{n+1}AX_n$ where n is an integer 1 to 4, M is a transition metal, and A is one or more of Al, Si, P, S, Ga, Ge, As, Cd, In, Sn, Ti, and Pb, and X is carbon and/or nitrogen. In embodiments, the ceramic layers can include one or more of $Al_2O_3$, $Y_2O_3$, $ZrO_2$, $TiO_2$, $SiO_2$, $Cr_2O_3$, ZrN, TiN, AlN, SiN, ZrC, TiC, SiC, NbC, $Ti_2AlC$, $Zr_2TiC$, FeAl, $Fe_2Al_3$, $FeAl_2$, $Fe_2Al_5$, $ZrAl_3$, $MoSi_2$, $NbSi_2$, Si, ($ZrO_2·SiO_2$), and ($ZrO_2·xY_2O_3$). In embodiments, the ceramic layers can include one or more of $Al_2O_3$, $ZrO_2$, and ZrN. In embodiments, the ceramic layers include or are $Al_2O_3$.

In embodiments, the metal layers include one or more of refractory metals, high-temperature metals, high-temperature metal alloys, and intermetallic compounds. As used herein, the term "high-temperature metals" refers to metals that can resist high heat (e.g., 600° C. or more). As used herein, the term "high-temperature metal alloys" refers to a mixture of metals that can resist high heat and corrosion more effectively than standard carbon steel. The high-temperature metals and/or high-temperature metal alloys can include one or more of stainless steel, chromium, nickel, iron, copper, cobalt, molybdenum, tungsten, and titanium. The refractory metals can include one or more of Nb, Mo, Ta, W, Re, Ti, Co, Cr, Mn, Zr, Tc, Ru, Rh, Hf, Os, and Ir. In embodiments, the refractory metals can include Nb, Mo, Ta, W, and Re. In embodiments, the metal layers can include one or more of Mo, W, Nb, Ta, Ni, Co, Fe, Ru, Pd, and alloys thereof.

Each metal layer and each ceramic layer, independently, can have a thickness on the nanoscale. In embodiments, each metal layer, and each ceramic layer, independently, can have a thickness about 0.1 nm to about 1000 nm. For example, each metal layer and each ceramic layer, independently, can have a thickness of about 5 nm to about 100 nm or about 5 nm to about 50 nm. In embodiments, each metal layer can have a thickness of about 25 nm to about 75 nm and each ceramics layer can have a thickness of about 5 nm to about 25 nm. For example, each metal layer can have a thickness of about 50 nm and each ceramic layer can have a thickness of about 15 nm. Each ceramic layer can have the same or different thicknesses. Each metal layer can have the same or different thicknesses. Further, various or all of the ceramic and metal layers can have the same or different thicknesses.

In embodiments, the plurality of alternating layers can have about 4 to 50 metal layers and ceramic layers total. For example, the plurality of alternating layers can have about 4 to about 45, about 4 to about 40, about 4 to about 30, about 4 to about 20, or about 10 to about 50, about 10 to about 40, about 10 to about 30, or about 20 to about 40, metal layers and ceramics layers combined. In embodiments, the plurality of alternating layers can have about 12 to about 18 metal layers, and about 12 to 18 ceramics layers.

In embodiments, the hydrogen permeation barrier coating whether provided as a single layer or multi-layer structure, can have a total thickness of about 300 nm to about 5 μm, or about 400 nm to about 3 μm, or about 500 nm to about 2 μm, or about 750 nm to about 1.5 μm. For example, the hydrogen permeation barrier coating has a total thickness of about 300 nm, 400 nm, 500 nm, 600 nm, 700 nm, 750 nm, 800 nm, 900 nm, 950 nm, 1000 nm (1 μm), 1.25 μm, 1.5 μm, 2 μm, 3 μm, 4 μm, or 5 μm. In embodiments, the hydrogen permeation barrier coating has a total thickness of about 1 μm. For example, when the hydrogen permeation barrier coating is used for nuclear reactors, the target thickness is about 1 μm.

In embodiments, the hydrogen permeation barrier coating can be monolithic and substantially pinhole free. Surfaces that are "substantially pinhole free" can have less than 1% pinhole density after deposition, or less than 0.1% pinhole density after deposition, or less than 0.001% pinhole density after deposition. Measurements for pinhole density can be found in Chai, Zhimin, Yuhong Liu, Jing Li, Xinchun Lu, and Dannong He. "Ultra-thin $Al_2O_3$ films grown by atomic layer deposition for corrosion protection of copper." *RSC Advances* 4, no. 92 (2014): 50503-50509.

It has been found that the microstructure of the hydrogen permeation barrier coating can affect the hydrogen permeability, particularly at high temperatures. Without intending to be bound by theory, it is believed that the hydrogen permeability can be affected by: (a) grain size (e.g., coarse or nanocrystalline), (b) grain shape (e.g., dendritic, columnar, or equiaxed), and (c) crystalline or amorphous microstructure (e.g., polycrystalline or nanocrystalline). In embodiments, each layer of the multi-layered hydrogen permeation barrier coatings can include its own unique microstructure. For example, a multi-layered hydrogen permeation barrier coating can include a ceramic layer (e.g., $ZrO_2$) having a nanocrystalline and equiaxed microstructure, and a metal layer having a nanocrystalline and equiaxed microstructure. For example, a multi-layered hydrogen permeation barrier coating can include a ceramic layer (e.g., alumina) having an amorphous microstructure, and a metal layer having a nanocrystalline and equiaxed microstructure.

The grain size of the hydrogen permeation barrier coating or one or more layers thereof has been observed to indirectly affect the permeation of $H_2$. Larger grains have been observed to allow higher $H_2$ diffusion as compared to smaller grains. When the microstructure of the hydrogen permeation barrier coating is nanocrystalline, high density of dislocations and numerous grain boundaries provided longer travel of atomic hydrogen through a crystal lattice. Therefore, it is believed that a hydrogen permeation barrier coating having a microstructure with nanocrystalline grains can improve high temperature performance.

In embodiments, the hydrogen permeation barrier coating can have equiaxed grains. $H_2$ permeation barrier coatings with dendritic and columnar grains generally have grain boundaries which originate near the substrate and extended toward the outer surface. This long and continuous grain boundary often provides an easy path (e.g., short circuit) or shorter travel time for the $H_2$ atoms to diffuse. In the case of equiaxed grains, the boundaries are more complex and present a tortuous path for the $H_2/H_3$ atoms to diffuse which forces the $H_2/H_3$ movement to slow down and often be trapped, resulting in superior hydrogen permeability performance (i.e., less $H_2$ permeability).

In embodiments, the hydrogen permeation barrier coating can have nanocrystalline microstructure. In general, hydrogen permeation barrier coatings with amorphous microstructures exhibit a large number of sites for hydrogen absorption, but many of these sites have high occupancy energy, and therefore, the hydrogen diffusivity in these materials is lower than the corresponding crystalline materials. Amorphous materials can perform well at lower temperature ranges, but at higher temperature, formation of hydrides can occur in conjunction with the possibility of crystalline transformations. This makes the use of amorphous materials at high temperature ranges detrimental to the performance hydrogen permeation barrier coating. Nanocrystalline materials typically display a lower permeability towards $H_2$ gas compared to a larger polycrystalline material.

Hydrogen permeation barrier coating deposition methods that can deliver the desired microstructure and grain orientations include atomic layer deposition. Other deposition methods can be used, particularly, where control over microstructure may not be as critical. Methods such as physical vapor deposition, chemical vapor deposition electrochemical deposition, and sputtering often lead to large polycrystalline and dendritic grain growths.

Coated Substrate

The coated substrate can include a hydrogen permeation barrier coating as disclosed herein and a substrate. In embodiments, the substrate can include one or more of a metal or alloys thereof, a metal with a ceramic composite structure, and a carbon fiber or composites thereof. In embodiments, the metal or metal alloy can include one or more of Ce, Yb, Mo, W, Nb, Ta, Ni, Co, and Fe, and alloys thereof.

Methods of Coating a Substrate

In accordance with embodiments herein, methods of coating substrates are provided. In embodiments, the methods include depositing a hydrogen permeation barrier coating onto a substrate via atomic layer deposition (ALD). ALD has advantageously been found to allow for deposition of hydrogen permeation barrier coatings or individual layers there of having a desired microstructure that includes a nanocrystalline structure and/or equiaxed grains. ALD deposition can be done using any suitable number of cycles and any suitable number of precursors. In embodiments in which the hydrogen permeation barrier coating is a multi-layer structure, individual layers can be deposited using one or more precursors.

For example, ALD deposition can utilize one or more first precursors and one or more second precursors. A pulse time for each precursor of about 0.1 seconds to 20 seconds and a purge time of about 5 seconds to about 60 seconds can be used, with a deposition temperature in a range of about 150° C. to about 400° C. As used herein, an "AB cycle" is defined as the total cycle including a cycle of the first precursor and a cycle of the second precursor. In embodiments, the methods can provide in each cycle of the first precursor (A), second precursor (B), third precursor (C), and fourth precursor (D) a pulse time of about 0.1 seconds to 20 seconds for each precursor and a purge time of about 5 seconds to about 60 seconds for each precursor at a deposition temperature in a range of about 150° C. to about 400° C. As used herein, an "ABCD cycle" is defined as a total cycle including a cycle of the first precursor, a cycle of the second precursor, a cycle of a third precursor, and a cycle of a fourth precursor.

In embodiments of the methods wherein the hydrogen permeation barrier coating is a single layer, depositing the hydrogen permeation barrier coating can include one or more first precursors selected from one or more of trimethyl aluminum (TMA), tris(dimethylamino)silane (TDMASi), tetrakis-dimethylamido-zirconium (TDMAZr), tetrakis-dimethylamido-titanium (TDMATi), tris(dimethylamido)aluminum (TDMAAl), tris(methylcyclopentadienyl)yttrium $(CpCH_3)_3Y)$, chromyl chloride $(CrO_2Cl_2)$, $WF_6$, and $MoF_6$.

In embodiments, the deposition of the hydrogen permeation barrier coating can further one or more second precursors selected from one or more of water, ammonia, methanol, hydrogen peroxide, and Disilane.

In embodiments, the methods can include one or more third and one or more fourth precursors. In embodiments, the one or more third precursors can include one or more of trimethyl aluminum (TMA), tris(dimethylamino)silane (TDMASi), tetrakis-dimethylamido-zirconium (TDMAZr), tetrakis-dimethylamido-titanium (TDMATi), tris(dimethylamido)aluminum (TDMAAl), tris(methylcyclopentadienyl) yttrium $(CpCH_3)_3Y)$, chromyl chloride $(CrO_2Cl_2)$, $WF_6$, and $MoF_6$. In embodiments, the one or more fourth precursors can include one or more of water, ammonia, methanol, hydrogen peroxide, and Disilane.

In each cycle, the deposition of the hydrogen permeation barrier coating or a layer thereof can include a pulse time of about 0.1 seconds or more. For example, the pulse time can be about 0.1, about 0.2, about 0.3, about 0.4, about 0.5, about 1, about 1.5, about 2, about 2.5, about 3, about 4, about 5, about 10, about 15, or about 20 seconds.

When depositing from two or more precursors, including from two or more first precursors and/or from a combination of two or more first and second precursors, the cycles of the precursors can be provided in an alternating or otherwise sequential (for more than two) manner, with purging between each cycle of the different precursors with an inert gas. In embodiments, the inert gas can include argon, nitrogen, or the like. Purging can be performed for about 0.1 seconds or more. In embodiments, the pulse can be for about 0.1, about 0.2, about 0.3, about 0.4, about 0.5, about 1, about 1.5, about 2, about 2.5, about 3, about 4, about 5, about 10, about 15, or about 20 seconds. In embodiments, the purge sequence can be for about 5 second or more. In embodiments, the purge sequence can be for about 5, about 10, about 15, about 20, about 25, about 30, about 40, about 50, or about 60 seconds.

The pulse and purge time can be dependent on the size of the substrate being coated. For example, a 2 inch long cylindrical tube being coated with the hydrogen permeation barrier coating of the disclosure can require a pulse time of about 0.1 seconds to about 3 seconds and a purge time of about 5 seconds to about 30 seconds. For example, a 10 meter long cylindrical tube being coated with the hydrogen permeation barrier coating of the disclosure can require a pulse time of up to 20 seconds and a purge time or up to 60 seconds.

In embodiments, the deposition can occur at a deposition temperature in a range of about 150° C. to about 400° C. For example, the temperature of deposition can be about 150° C., about 175° C., about 200° C., about 220° C., about 230° C., about 240° C., about 250° C., about 260° C., about 300° C., about 350° C., or about 400° C.

In embodiments, the methods of coating a substrate herein can provide coatings that have low defect densities (e.g., about 0.001% to about 0.1%). The coated substrates can have defect densities of about 0.001% to about 0.1%. For example, the coated substrates can have defect densities of about 0.001%, about 0.005%, about 0.01%, about 0.05%, or about 0.1%.

In embodiments, each AB cycle or each ABCD cycle can have a thickness of about 0.5 Å to about 5 Å. The thickness of each AB cycle is dependent upon the resulting chemical that has been generated from the ALD deposition. In embodiments, the thickness per cycle can be about 0.5 Å, about 0.6 Å, about 0.7 Å, about 0.8 Å, about 0.9 Å, about 1 Å, about 1.1 Å, about 1.2 Å, about 1.5 Å, about 2 Å, about 2.5 Å, about 3 Å, about 4 Å, or about 5 Å. For example, a single layered hydrogen permeation barrier coating of alumina with a thickness of 1 micron will undergo about 10,000 AB cycles. For example, a single layered hydrogen permeation barrier coating of $Si_3N_4$ with a thickness of 1 micron will undergo about 16,667 cycles.

In embodiments, the hydrogen permeation barrier coating can have a multi-layer structure. In embodiments of the methods wherein the hydrogen permeation barrier coating is a multi-layer structure, the deposition can include depositing a ceramic layer via atomic layer deposition onto a substrate; depositing a metal layer via atomic layer deposition onto the ceramic layer; and repeating each depositing step at least once such that each ceramic layer is deposited on a metal layer and each metal layer is deposited on a ceramic layer to form the coated substrate. In embodiments of the methods wherein the hydrogen permeation barrier coating is a multi-layer structure, the deposition can include depositing a first ceramic layer via atomic layer deposition onto a substrate; depositing a second layer via atomic layer deposition onto the ceramic layer; and repeating each depositing step at least once such that each first ceramic layer is deposited on a second ceramic layer and each second ceramic layer is deposited on a first ceramic layer to form the coated substrate. It is provided herein that the first ceramic layer and the second ceramic layer have different chemical compositions from one another. In embodiments, each depositing step can be repeated 2 or more times. In embodiments, each depositing step can be repeated, 2, 3, 4, 5, 6, 7, 8, 9, 10, 11, 12, 13, 14, 15, 16, 17, 18, 19, 20, 25, 30, 35, 40, 45, 50, 60, 70, 80, 90, or 100 times. In embodiments, each depositing step can be repeated 3 or more time, 5 or more times, 5 to 20 times, 5 to 10 times, 10 to 20 times, 10 to 15 times, 15 to 20 times, 5 to 60 times, 10 to 100 times, 10 to 50 times, 15 to 40 times, 20 to 30 times, or 15 to 25 times.

As provided above for the single layer hydrogen permeation barrier coatings, the methods for the multilayered hydrogen permeation barrier coatings herein provide each depositing step can include in each cycle of the at least first precursor (A) and second precursor (B) a pulse time of about 0.1 seconds to 20 seconds for each precursor and a purge time of about 5 seconds to about 60 seconds for each precursor at a deposition temperature in a range of about 150° C. to about 400° C.

In embodiments, each AB cycle or each ABCD cycle can have a thickness of about 0.5 Å to about 5 Å. In embodiments, the thickness per cycle can be about 0.5 Å, about 0.6 Å, about 0.7 Å, about 0.8 Å, about 0.9 Å, about 1 Å, about 1.1 Å, about 1.2 Å, about 1.5 Å, about 2 Å, about 2.5 Å, about 3 Å, about 4 Å, or about 5 Å. For example, a multilayered hydrogen permeation barrier coating of alumina/W with a thickness of 15 nm for each alumina layer and 50 nm for each tungsten layer and a total thickness of about 960 nm will undergo about 150 AB cycles for each alumina layer and about 167 AB cycles for each tungsten layer for a total of 15 alumina layer and 15 tungsten layers.

In each cycle of the first precursor and the second precursor, the deposition of the hydrogen permeation barrier coating can include a pulse time of about 0.1 seconds or more. For example, the pulse time can be about 0.1, about 0.2, about 0.3, about 0.4, about 0.5, about 1, about 1.5, about 2, about 2.5, about 3, about 4, about 5, about 10, about 15, or about 20 seconds.

When depositing from two or more precursors, including from two or more first precursors and/or from a combination of two or more first and second precursors, the cycles of the precursors can be provided in an alternating or otherwise sequential (for more than two) manner, with purging between each cycle of the different precursors with an inert gas. In embodiments, the inert gas can include argon, nitrogen, or the like. Purging can be performed for about 0.1 seconds or more. In embodiments, the pulse can be for about 0.1, about 0.2, about 0.3, about 0.4, about 0.5, about 1, about 1.5, about 2, about 2.5, about 3, about 4, about 5, about 10, about 15, or about 20 seconds. In embodiments, the purge sequence can be for about 5 second or more. In embodiments, the purge sequence can be for about 5, about 10, about 15, about 20, about 25, about 30, about 40, about 50, or about 60 seconds.

In embodiments, the deposition can occur at a deposition temperature in a range of about 150° C. to about 400° C. For example, the temperature of deposition can be about 150° C., about 175° C., about 200° C., about 220° C., about 230° C., about 240° C., about 250° C., about 260° C., about 300° C., about 350° C., or about 400° C.

In embodiments, the methods of coating a substrate herein can provide a multilayered hydrogen permeation barrier coatings that have low defect densities (e.g., about 0.001% to about 0.1%). The coated substrates can have defect densities of about 0.001% to about 0.1%. For example, the coated substrates can have defect densities of about 0.001%, about 0.005%, about 0.01%, about 0.05%, or about 0.1%.

Advantageously, the coated substrate includes a hydrogen permeation barrier coating that can be advantageously provided as pin-hole free and monolithic. Moreover, the hydrogen permeation barrier coating can be advantageously enabled by atomic layer deposition (ALD) to provide exceptional hydrogen barrier performance, and can be enhanced by nanoscale multilayer structure with metal layers for superior thermal shock resistance.

Figure 2:
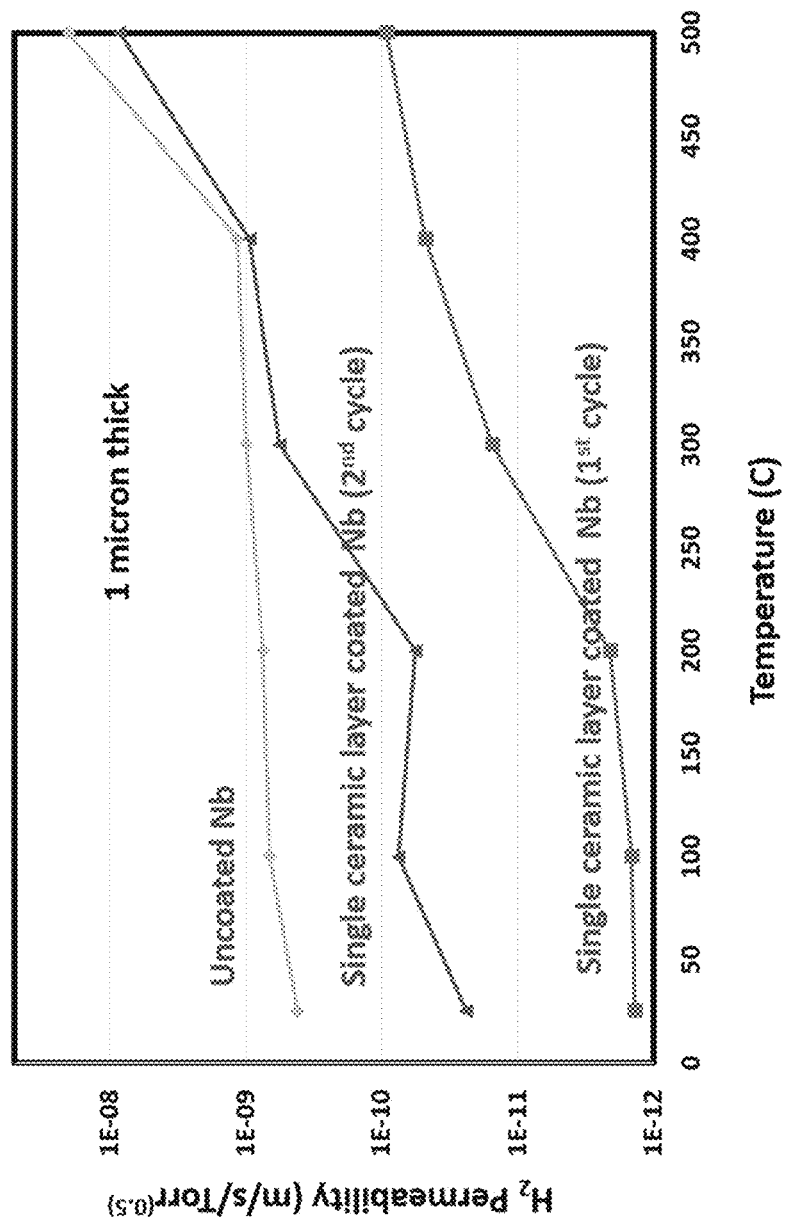
FIG. 2 is a graph of the $H_2$ permeability versus temperature of an uncoated substrate, a single ceramic layer coated substrate in accordance with embodiments of the disclosure after one cycle from room temperature to 500° C. in a 4% $H_2$/96% Ar atmosphere, and a single ceramic layer coated substrate in accordance with embodiments of the disclosure after one thermal cycle from room temperature to 500° C. in a 4% $H_2$/96% Ar atmosphere.
Figure 3:
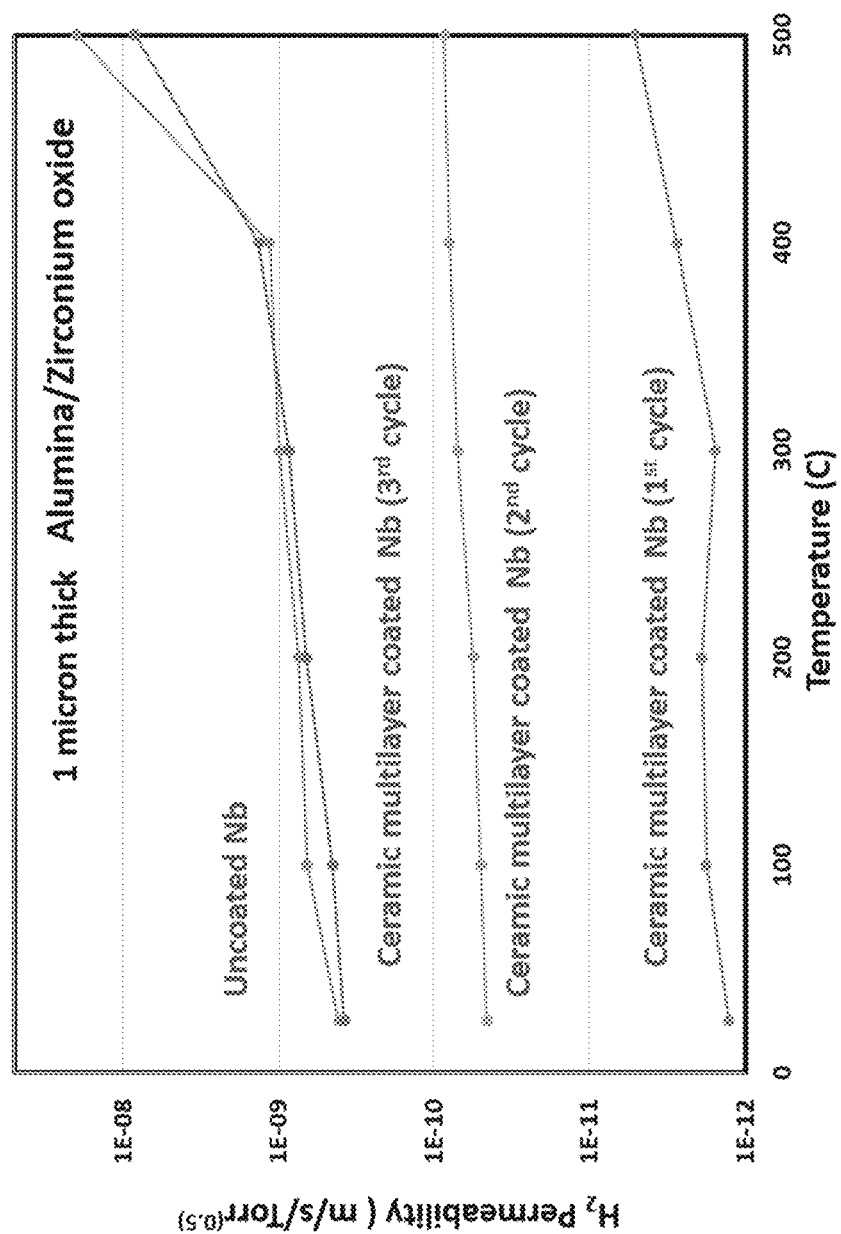
FIG. 3 is a graph of the $H_2$ permeability versus temperature of an uncoated substrate, a multi-layer coated substrate in accordance with embodiments of the disclosure after one cycle from room temperature to 500° C. in a 4% $H_2$/96% Ar atmosphere, a multi-layer coated substrate in accordance with embodiments of the disclosure after two cycles from room temperature to 500° C. in a 4% $H_2$/96% Ar atmosphere.
Figure 4:
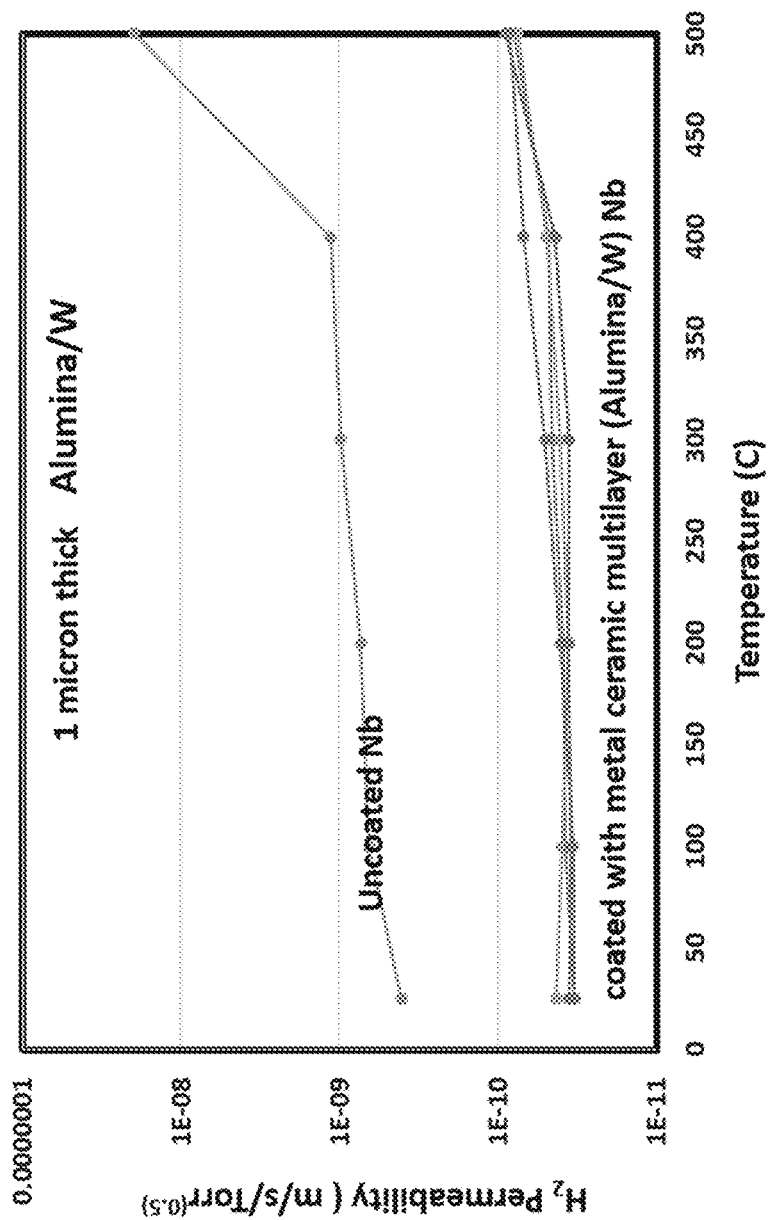
FIG. 4 is a graph of the $H_2$ permeability versus temperature of an uncoated substrate, and a multi-layer coated substrate (alumina/W) in accordance with embodiments of the disclosure after one cycle from room temperature to 500° C. in a 4% $H_2$/96% Ar atmosphere, after two cycles, after three cycles, and after four cycles from room temperature to 500° C. in a 4% $H_2$/96% Ar atmosphere.

FIG. 1 is a schematic illustration of an experimental set-up to test the hydrogen permeation of the hydrogen permeation barrier coating in accordance with embodiments of the disclosure. The furnace includes a coated substrate as described herein. FIG. 1 can be broken down into two sections: (1) a pressurized section (left part of the schematic illustration) and (2) a vacuum section (right part of the schematic illustration). The pressurized section provides a source of hydrogen using a gas cylinder as the hydrogen source (4% $H_2$ with the balance being Ar) and the pressure of the $H_2$ gas is regulated and measured to ensure control of the hydrogen partial pressure. The vacuum section measures the permeated hydrogen amount and is continuously pumped at a constant rate by a turbo pump to maintain high vacuum. The vacuum section further includes a residual gas analyzer (RGA) which is used to measure the hydrogen partial amount. These two sections of the schematic illustration are connected by a disc sample with or without a hydrogen permeation barrier coating. The disc sample creates a pressure boundary and allows small amounts of hydrogen to permeate through for the RGA measurement. In order to measure the permeation at high temperature, the disc sample is located in a tube furnace. The results of several experiments using the experimental set-up in FIG. 1 are shown in FIGS. 2-4. FIG. 2 is a graph showing the results of hydrogen permeation experiments using an uncoated substrate, a single ceramic layer coated substrate in accordance with embodiments of the disclosure after one cycle from room temperature to 500° C. in a 4% $H_2$/96% Ar atmosphere, and a single ceramic layer coated substrate in accordance with embodiments of the disclosure after one thermal cycle from room temperature to 500° C. in a 4% $H_2$/96% Ar atmosphere. FIG. 3 is a graph showing the results of hydrogen permeation experiments using an uncoated substrate, a multi-layer coated substrate in accordance with embodiments of the disclosure after one cycle from room temperature to 500° C. in a 4% $H_2$/96% Ar atmosphere, a multi-layer coated substrate in accordance with embodiments of the disclosure after two cycles from room temperature to 500° C. in a 4% $H_2$/96% Ar atmosphere. FIG. 4 is a graph showing the results of hydrogen permeation experiments using an uncoated substrate, and a multi-layer coated substrate (alumina/W) in accordance with embodiments of the disclosure after one cycle from room temperature to 500° C. in a 4% $H_2$/96% Ar atmosphere, after two cycles, after three cycles, and after four cycles from room temperature to 500° C. in a 4% $H_2$/96% Ar atmosphere.

Figure 5A:
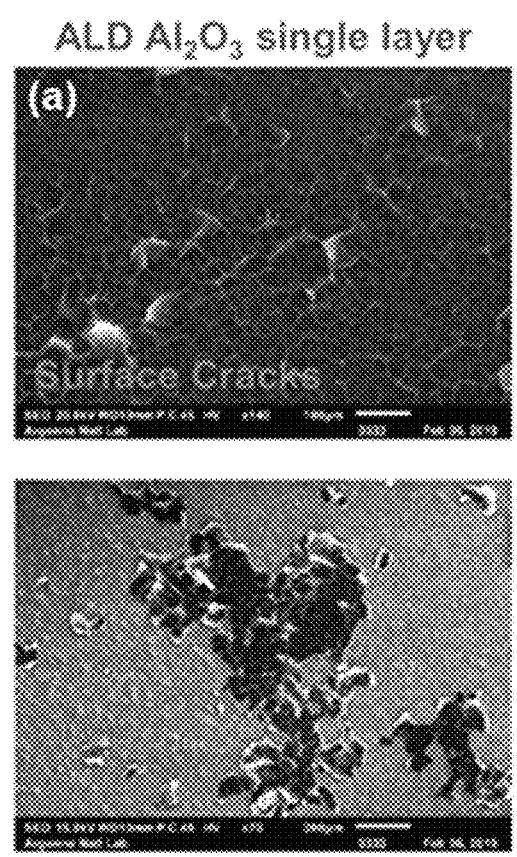
FIG. 5A are scanning electron microscopy (SEM) images of a hydrogen permeation barrier coating single layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere.
Figure 5B:
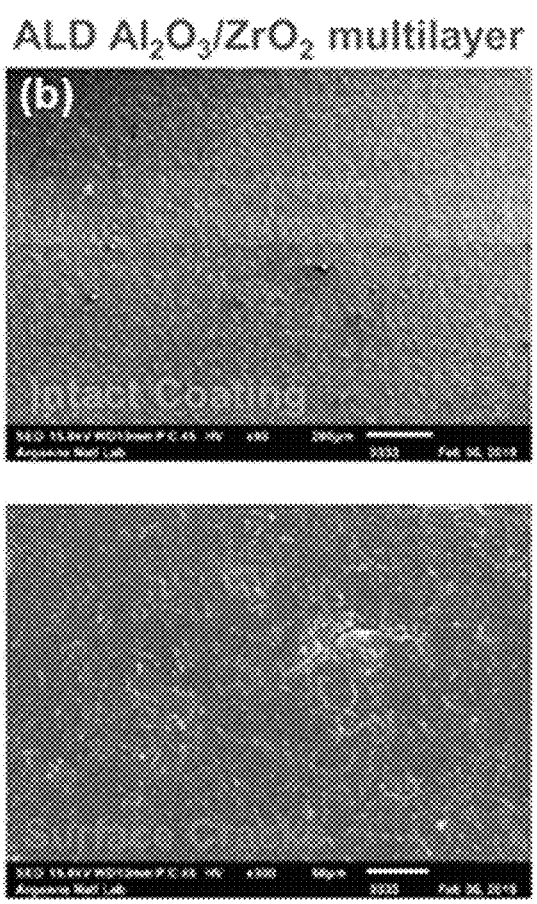
FIG. 5B are scanning electron microscopy (SEM) images of a hydrogen permeation barrier coating multi-layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere.
Figure 5C:
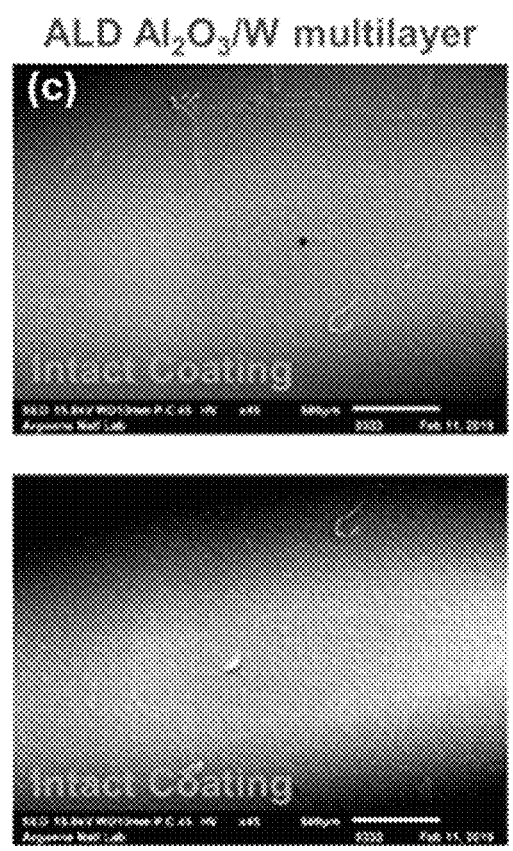
FIG. 5C are scanning electron microscopy (SEM) images of a hydrogen permeation barrier coating multi-layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere.

FIG. 5A are scanning electron microscopy (SEM) images of a hydrogen permeation barrier coating single layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere. FIG. 5B are scanning electron microscopy (SEM) images of a hydrogen permeation barrier coating multi-layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere. FIG. 5C are scanning electron microscopy (SEM) images of a hydrogen permeation barrier coating multi-layer structure in accordance with embodiments of the disclosure after one heat cycle from room temperature to 900° C. in a 4% $H_2$/96% Ar atmosphere and after four heat cycles from room temperature to 900° C. in a 4% $H_2$/96% Ar atmosphere.

Figure 6:
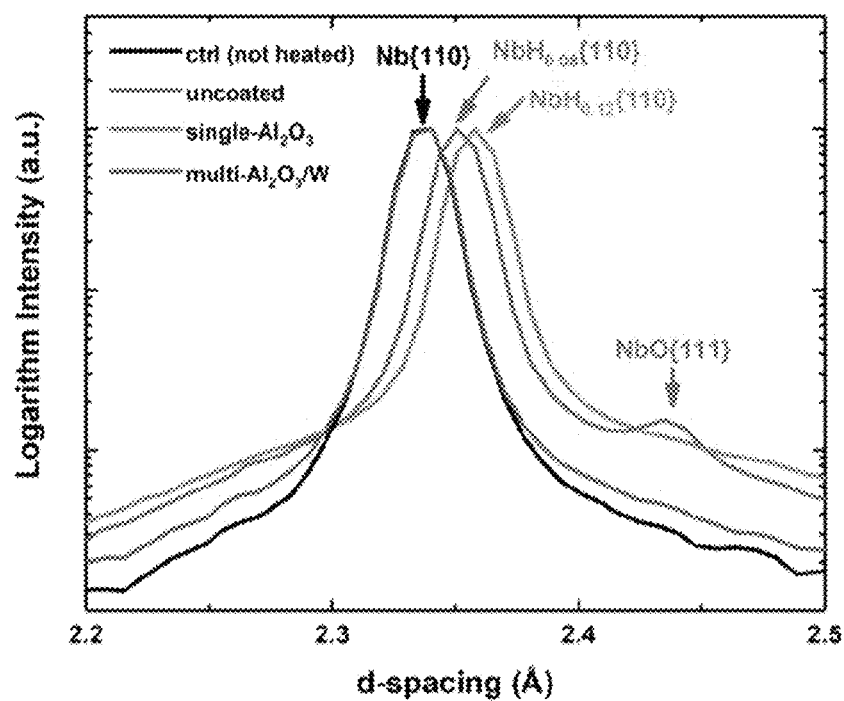
FIG. 6 is a graph of the phase identification of various transition metal layers that are uncoated, coated with a single $H_2$ permeation barrier layer in accordance with embodiments disclosed herein, and coated with a multilayered $H_2$ permeation barrier layer in accordance with embodiments disclosed herein.

FIG. 6 is a graph of the phase identification of various substrates that are uncoated, coated with a single hydrogen permeation barrier coating in accordance with embodiments disclosed herein, and coated with a multilayered hydrogen permeation barrier coating in accordance with embodiments disclosed herein.

EXAMPLES

In the examples below, characterization of the moderation module properties and methods of preparing the moderation module are disclosed.

Example 1—Single Layer and Multi-Layer Hydrogen Permeation Barrier Coating Deposition Methods All these parameters are developed for coating inside and outside of the metal tube of dimension 11 mm (OO)×10 mm (ID)×2 inches in length.

| ALD deposited Coating Chemistry | Temperature (° C.) | Cycle | Chemical | Pulse (seconds) | Purge (seconds) |
|---|---|---|---|---|---|
| $ZrO_2$ | 200-225 | 1 | TDMAZr | 1 | 20 |
| | | 2 | $H_2O$ | 1 | 15 |

| ALD deposited Coating Chemistry | Temperature (° C.) | Cycle | Chemical | Pulse (seconds) | Purge (seconds) |
|---|---|---|---|---|---|
| $Al_2O_3$ | 175-220 | 1 | TMA | 1 | 10 |
| | | 2 | $H_2O$ | 0.5 | 10 |
| $SiO_2$ | 175-225 | 1 | TDMASi | 2 | 20 |
| | | 2 | $H_2O_2$ | 1 | 15 |
| $Y_2O_3$ | 220-300 | 1 | $(CpCH_3)_3Y$ | 2 | 20 |
| | | 2 | $H_2O$ | 0.5 | 15 |
| $Cr_2O_3$ | 250-350 | 1 | $CrO_2Cl_2$ | 1 | 15 |
| | | 2 | $CH_3OH$ | 1 | 15 |
| $TiO_2$ | 200-230 | 1 | TDMATi | 1 | 20 |
| | | 2 | $H_2O$ | 1 | 15 |
| $ZrSiO_4$ | 200-230 | 1 | TDMAZr | 1 | 20 |
| | | 1 | $H_2O$ | 1 | 15 |
| | | 2 | TDMASi | 2 | 20 |
| | | 2 | $H_2O_2$ | 1 | 15 |
| ZrN | 200-225 | 1 | TDMAZr | 1 | 20 |
| | | 2 | $NH_3$ | 1 | 20 |
| TiN | 200-250 | 1 | TDMATi | 2 | 20 |
| | | 2 | $NH_3$ | 1 | 20 |
| AlN | 230-260 | 1 | TDMAAl | 2 | 20 |
| | | 2 | $NH_3$ | 1 | 20 |
| $Si_3N_4$ | 200-240 | 1 | TDMASi | 2 | 20 |
| | | 2 | $NH_3$ | 1 | 20 |
| W | 150-175 | 1 | $WF_6$ | 1 | 15 |
| | | 2 | $Si_2H_6$ | 0.5 | 15 |
| Mo | 150-175 | 1 | $MoF_6$ | 1 | 15 |
| | | 2 | $Si_2H_6$ | 0.5 | 15 |

Target Thickness 1 Micron:

ALD $Al_2O_3$: One AB cycle generated: 1 Å/cycle and therefore ~10000 AB cycles to get ~1-micron coating.

ALD $ZrO_2$: One AB cycle generated: 1 Å/cycle and therefore ~10000 AB cycles to get ~1-micron coating.

ALD $SiO_2$: One AB cycle generated: 1.0-1.5 Å/cycle and therefore ~10000-6667 AB cycles to get ~ 1-micron coating.

ALD $ZrSiO_4$: One ABCD cycle generated: 2.0-2.5 Å/cycle and therefore ~5000-4000 AB cycles to get ~ 1-micron coating.

ALD ZrN: One AB cycle generated: 0.95 Å/cycle and therefore ~10520 AB cycles to get ~ 1-micron coating ALD $Y_2O_3$: One AB cycle generated: 1.1 Å/cycle and therefore ~9090 AB cycles to get ~1-micron coating.

ALD $Si_3N_4$: One AB cycle generated: 0.6 Å/cycle and therefore ~16667 AB cycles to get ~ 1-micron coating.

ALD AlN: One AB cycle generated: 0.9 Å/cycle and therefore ~11110 AB cycles to get ~1-micron coating.

ALD $TiO_2$: One AB cycle generated: 1 Å/cycle and therefore ~10000 AB cycles to get ~1-micron coating.

| ALD deposited Coating Chemistry | Temp. (° C.) | Half Cycle | Chemical | Precursor Temp.(° C.) (increases pulse pressure) | Pulse (seconds) | Purge (seconds) | Rate of growth per full one ALD cycle (Å) |
|---|---|---|---|---|---|---|---|
| $ZrO_2$ | 200-225 | A | TDMAZr | 75 | 1 | 20 | ~1.0 per AB cycle |
| | | B | $H_2O$ | R.T. | 1 | 15 | |
| $Al_2O_3$ | 175-220 | A | TMA | 40 | 1 | 10 | ~1.0 per AB cycle |
| | | B | $H_2O$ | R.T. | 0.5 | 10 | |
| $SiO_2$ | 175-225 | A | TDMASi | 50 | 2 | 20 | ~1.0-1.5 per AB cycle |
| | | B | $H_2O_2$ | R.T. | 1 | 15 | |
| $Y_2O_3$ | 220-300 | A | $(CpCH_3)_3Y$ | 75 | 2 | 20 | ~1.1 per AB cycle |
| | | B | $H_2O$ | R.T. | 0.5 | 15 | |
| $ZrSiO_4$ | 200-230 | A | TDMAZr | 75 | 1 | 20 | ~2.0-2.5 per ABCD cycle |
| | | B | $H_2O$ | R.T. | 1 | 15 | |

-continued

| ALD deposited Coating Chemistry | Temp. (° C.) | Half Cycle | Chemical | Precursor Temp.(° C.) (increases pulse pressure) | Pulse (seconds) | Purge (seconds) | Rate of growth per full one ALD cycle (Å) |
|---|---|---|---|---|---|---|---|
| | | C | TDMASi | 50 | 2 | 20 | |
| | | D | $H_2O_2$ | R.T. | 1 | 15 | |
| ZrN | 200-225 | A | TDMAZr | 75 | 1 | 20 | ~0.95 per AB cycle |
| | | B | $NH_3$ | R.T. | 1 | 20 | |
| AlN | 230-270 | A | TDMAAl | 75 | 2 | 20 | ~0.9 per AB cycle |
| | | B | $NH_3$ | R.T. | 1 | 20 | |
| $Si_3N_4$ | 200-240 | A | TDMASi | 50 | 2 | 20 | ~0.6 per AB cycle |
| | | B | $NH_3$ | R.T. | 1 | 20 | |
| Mo | 150-175 | A | $MoF_6$ | R.T. | 1 | 15 | ~3.5 per AB cycle |
| | | B | $Si_2H_6$ | R.T. | 0.5 | 15 | |
| W | 150-175 | A | $WF_6$ | R.T. | 1 | 15 | |
| | | B | $Si_2H_6$ | R.T. | 0.5 | 15 | ~3.0 per AB cycle |
| $Cr_2O_3$ | 250-350 | A | $CrO_2Cl_2$ | 100 | 1 | 15 | ~0.5-0.6 per AB cycle |
| | | B | $CH_3OH$ | R.T. | 1 | 15 | |
| $TiO_2$ | 200-230 | A | TDMATi | 75 | 1 | 20 | ~1.0 per AB cycle |
| | | B | $H_2O$ | R.T. | 1 | 15 | |

ALD $Al_2O_3$ (10 nm each)/$ZrO_2$ (10 nm each): One AB cycle for Alumina generated: 1 Å/cycle and therefore ~100 AB cycles to get ~ 10 nm coating thickness for each layer. One AB cycle for $ZrO_2$ generated: 1 Å/cycle and therefore ~100 AB cycles to get ~ 10 nm coating thickness for each layer. This multilayer recipe was repeated 50 times in total to get a final thickness ~ 1000 nm.

ALD $Al_2O_3$ (5 nm each)/$ZrO_2$ (5 nm each): One AB cycle for Alumina generated: 1 Å/cycle and therefore ~50 AB cycles to get ~ 5 nm coating thickness for each layer. One AB cycle for $ZrO_2$ generated: 1 Å/cycle and therefore ~50 AB cycles to get ~ 5 nm coating thickness for each layer. This multilayer recipe was repeated for 100 times in total to get a final thickness ~1000 nm.

ALD $Al_2O_3$ (15 nm each)/W (50 nm each): One AB cycle for Alumina generated: 1 Å/cycle and therefore ~150 AB cycles to get ~ 15 nm coating thickness for each layer. One AB cycle for W generated: 3 Å/cycle and therefore ~167 AB cycles to get ~ 50 nm coating thickness for each layer. This multilayer recipe was repeated for 15 times in total to get a final thickness 960 nm which is used for the $H_2$ barrier coating.

Example 3—Testing Hydrogen Permeability of Single and Multi-Layered Hydrogen Permeation Barrier Coatings The net $H_2$ permeation was measured based on multiple ~1-micron thick hydrogen permeation barrier coating over a Nb disc compared to an uncoated Nb disc within a temperature range from RT to 500° C.

An uncoated Nb disc (500 μm thick) was mechanically polished, and then ultrasonically cleaned. This Nb disc was installed in the $H_2$ detection device shown in FIG. 1 (measures partial pressure with a residual gas analyzer (RGA) of any gas up to a pressure from $10^{-5}$ Torr to $10^{-14+}$ Torr, that can diffuse or permeate through the studied metal/ceramic disc (in this case Nb) towards the high vacuum side of the system shown in FIG. 1). This $H_2$ detection device was designed to be operated and limited to a maximum temperature of 500° C., because the plumbing and the high vacuum connections used were made of SS 316, and it can only withstand to 512° C.) For this measurement, 4% $H_2$/96% Ar was used and a pressure of 25 psi was applied to one side of the Nb disc.

The Nb disc was not immediately taken to the highest temperature (500° C.), but it was done in steps. In each step the temperature was ramped up by 100° C. within a timeframe of 150 minutes and then followed by a hold at the achieved temperature for 24 hours. The measurement of the $H_2$ partial pressure was performed, in the last one hour of the hold. This was done to stabilize the temperature and the $H_2$ data (e.g. R.T. to 100° C. in 150 min, then hold at the temperature for 24 hours and the $H_2$ partial pressure was measured at around 23 hours of the hold, then the temperature was increased to 200° C. and so on until 500° C. was achieved). The Nb disc coated with 1 micron of alumina went through the same temperature regime.

The difference in the calculated $H_2$ permeation with and without coating is evident after the first cycle as shown in FIG. 2 (1st cycle) (which is R.T. to 500° C. following the above steps).

Further, the coating integrity was tested. A coated Nb disc with a single layer of ALD alumina was tested to study whether the ALD alumina coating can survive the thermal stresses originating from 500° C. to R.T. cooling. From the data presented in FIG. 2, it can be seen that the coating began to fail during second cycle (2nd cycle) and it is evident even though initially the net $H_2$ permeation values were lower than uncoated Nb disc, the overall $H_2$ permeation was higher than first cycle coated Nb results. All the experimental conditions and parameters were the same as the conditions of the first cycle, so it can be confidently concluded that the ALD alumina integrity has been deteriorated (cracking or spalled).

Thus, it was found that that single ALD alumina coating is not suitable for applications where large thermal cycling (High T to Low T) is involved, as the integrity was lost just from one thermal/heat cycling.

The same experiment was repeated with a multilayered coating including two different ceramic layers (i.e., alumina and zirconium oxide) as shown in FIG. 3. The results show that the multilayered hydrogen permeation barrier coating had improved performance as the coating performed better that uncoated Nb after a second cycle, but deteriorated after a $3^{rd}$ cycle.

Finally, the same experiment was repeated with a multilayered coating in accordance with the disclosure, including ceramic layers and metal layers (i.e., alumina ceramic layer and tungsten metal layer) as shown in FIG. 4. The results showed that the multilayered hydrogen permeation barrier coating had much improved performance. The metal/ceramic multilayered hydrogen barrier coating did not show any deterioration after 4 thermal cycles and had much better overall hydrogen permeation properties than the uncoated Nb disc.

Example 4: Thermal Stability Testing of the Hydrogen Permeability Barrier Coatings Although ceramic materials such as SiC, TiN, α-phase and amorphous $Al_2O_3$ all provide sufficiently low hydrogen permeability at high temperatures 200° C. to 1100° C. (Investigation of the environment fate of tritium in the atmosphere, Canadian Nuclear Safety Commission (CNSC), INFO-0792, 2009), it is found that a single layer ceramic coating did not withstand the thermal stress generated from the coefficient of thermal expansion mismatch (FIG. 5A). In FIG. 5B, a Nb foil (material used as a module liner) was coated with 1 micron thick alumina, but after exposure to 900° C. for one thermal cycle varying from R.T to 900 C, the surface coating completely cracks on majority of the surface areas and largely spalls off after exposure to 4th such thermal cycling (FIG. 5A).

Coatings having multiple ceramic layers ($Al_2O_3/ZrO_2$) also did not demonstrate resistance to multiple thermal cycles. Multiple ceramic layers of $Al_2O_3$ and $ZrO_2$ were deposited over an Nb foil. The sample was heated to 900° C. for one thermal cycle (varying from R.T to 900 C), and able to withstand such thermal cycling (FIG. 5B). However, after exposure to three more such thermal cycles, the ceramic multilayer exhibit substantial degradation, as shown in FIG. 5B. The coating cracked all over the material surface.

By contrast, a hydrogen permeation barrier coating in accordance with the disclosure was found to be capable of withstanding multiple thermal cycles without substantial degradation. Multilayers of $W/Al_2O_3$ were chosen. One micron of this multilayer was deposited over Nb foil. The multilayer included 15 layers of 50 nm each W layer and 15 layers of 15 nm each alumina layer. This coated Nb foil with the multilayer coating was exposed to 900° C. for one thermal cycle (varying from R.T to 900 C), at first, observations were very similar to the $Al_2O_3/ZrO_2$ ceramic-ceramic multilayers (FIG. 5C). The improvement from this design was more evident after it was exposed to three more similar thermal cycles. The coating looked completely intact and no signs of spalling or cracking was observed (FIG. 5C).

The use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Still further, the figures depict embodiments for purposes of illustration only. One of ordinary skill in the art will readily recognize from the following discussion that alternative embodiments of the structures and methods illustrated herein may be employed without departing from the principles described herein.

Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed:

1. A hydrogen permeation barrier coating, comprising: a plurality of alternating layers, wherein the plurality of alternating layers comprises alternating metal layers and ceramics layers, wherein each alternating layer, independently, comprises a microstructure comprising nanocrystalline and/or equiaxed grains, and wherein the hydrogen permeation barrier coating has a total thickness of about 200 nm to about 2 microns.

2. The hydrogen permeation barrier coating of claim 1, wherein the metal layers comprise one or more of refractory metals, high-temperature metals, high-temperature metal alloys, and intermetallic compounds.

3. The hydrogen permeation barrier coating of claim 1, wherein the ceramics layers comprise one or more of oxides, nitrides, carbides, aluminides, silicides, elemental ceramics, complex oxides, and max phases, wherein the max phases are represented by the formula $M_{n+1}AX_n$ where n is an integer 1 to 4, M is a transition metal, and A is one or more of Al, Si, P, S, Ga, Ge, As, Cd, In, Sn, Ti, and Pb, and X is carbon and/or nitrogen.

4. The hydrogen permeation barrier coating of claim 3, wherein the ceramic layers comprise $Al_2O_3$.

5. The hydrogen permeation barrier coating of claim 1, wherein the metal layers comprise W.

6. The hydrogen permeation barrier coating of claim 1, wherein the plurality of alternating layers comprises 4 to 50 layers.

7. The hydrogen permeation barrier coating of claim 1, wherein each ceramics layer has a thickness of about 5 nm to about 25 nm.

8. The hydrogen permeation barrier coating of claim 1, wherein each metal layer has a thickness of about 25 nm to about 75 nm.

9. The hydrogen permeation barrier coating of claim 1, wherein the hydrogen permeation barrier coating is monolithic and substantially pinhole free.

10. The hydrogen permeation barrier coating of claim 1, wherein the hydrogen permeation barrier coating can withstand temperatures of greater than 600° C. in the presence of hydrogen, without substantial degradation.

11. The hydrogen permeation barrier coating of claim 1 having a hydrogen permeation of $1 \times 10^{-10}$ m/s/Torr$^{(0.5)}$ or less over a 24-hour time period at a temperature of 500° C. or more.

12. The hydrogen permeation barrier coating of claim 1 having less than 1% pinhole density after deposition.

13. The hydrogen barrier coating of claim 1, wherein the metal layers are deposited by physical vapor deposition.

14. A method of forming the hydrogen permeation barrier coating of claim 1 on a substrate comprising: depositing a hydrogen permeation barrier coating onto a substrate via atomic layer deposition (ALD), wherein the depositing comprises two or more deposition cycles of at least a first precursor and separately two or more deposition cycles of at least a second precursor such that the plurality of alternating layers comprising the alternating metal layers and ceramic layers are formed on the substrate resulting from the first precursor deposition and the second precursor deposition, and each cycle of the first and second precursors comprises a pulse time of about 0.1 seconds to 20 seconds, a purge time of about 5 seconds to about 60 seconds, and a deposition temperature in a range of about 150° C. to about 400° C.

15. The method of claim 14, wherein the substrate comprises one or more of a metal or alloy thereof, a metal with a ceramic composite structure, and a carbon fiber or composites thereof.

16. The method of claim 14, wherein each depositing step is repeated 5 or more times.

17. The method of claim 14, wherein the metal layers comprise one or more of refractory metals, high-temperature metals, high-temperature metal alloys, and intermetallic compounds.

18. The method of claim 14, wherein the ceramic layers comprise one or more of oxides, nitrides, carbides, aluminides, silicides, elemental ceramics, complex oxides, and max phases, wherein the max phases are represented by the formula $M_{n+1}AX_n$ where n is an integer 1 to 4, M is a transition metal, and A is one or more of Al, Si, P, S, Ga, Ge, As, Cd, In, Sn, Ti, and Pb, and X is carbon and/or nitrogen.

19. A method of forming the hydrogen permeation barrier coating of claim 1 comprising:
    depositing a ceramic layer onto the substrate;
    depositing a metal layer onto the ceramic layer,
    repeating alternatingly the depositing of the ceramic layer and the metal layer, wherein each depositing is performed under conditions sufficient to form a respective one of the ceramic or metal layers having a microstructure comprising nanocrystalline and/or equiaxed grains.

20. The method of claim 19, comprising depositing by one or more of physical vapor deposition, chemical vapor deposition, electrochemical deposition, and atomic layer deposition.

21. The method of claim 19, comprising depositing the metal layer by physical vapor deposition and the ceramic layer by atomic layer deposition.

* * * * *